US009437389B2

(12) United States Patent
Åberg et al.

(10) Patent No.: US 9,437,389 B2
(45) Date of Patent: Sep. 6, 2016

(54) ASSEMBLY AND METHOD FOR REDUCING FOIL WRINKLES

(75) Inventors: Andreas Åberg, Malmö (SE); Ulrika Linné, Lund (SE); Urs Hostettler, Thun (CH)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 876 days.

(21) Appl. No.: 13/574,515

(22) PCT Filed: Feb. 1, 2011

(86) PCT No.: PCT/SE2011/050103

§ 371 (c)(1), (2), (4) Date: Sep. 11, 2012

(87) PCT Pub. No.: WO2011/096875

PCT Pub. Date: Aug. 11, 2011

(65) Prior Publication Data

US 2013/0000253 A1 Jan. 3, 2013

Related U.S. Application Data

(60) Provisional application No. 61/304,307, filed on Feb. 12, 2010.

(30) Foreign Application Priority Data

Feb. 8, 2010 (SE) ........................................ 1000114

(51) Int. Cl.
*H05K 13/00* (2006.01)
*B23K 15/00* (2006.01)
(Continued)

(52) U.S. Cl.
CPC ................. *H01J 33/04* (2013.01); *G21K 5/02* (2013.01); *H01J 5/18* (2013.01); *B65B 55/08* (2013.01);

(Continued)

(58) Field of Classification Search
None
See application file for complete search history.

(56) References Cited

U.S. PATENT DOCUMENTS 1,907,507 A * 5/1933 Coolidge ..................... 313/420
2,449,872 A 9/1948 Brasch et al.

(Continued)

FOREIGN PATENT DOCUMENTS

CN 85 1 08631 A 8/1986
CN 1663012 A 8/2005

(Continued)

OTHER PUBLICATIONS

International Search Report (PCT/ISA/210) issued on May 10, 2011, by the Swedish Patent Office as the International Searching Authority for International Application No. PCT/SE2011/050103.

(Continued)

*Primary Examiner* — Hemant M Desai
*Assistant Examiner* — Mobeen Ahmed
(74) *Attorney, Agent, or Firm* — Buchanan Ingersoll & Rooney PC

(57) ABSTRACT

An assembly of a support plate and an exit window foil for use in an electron beam device. The support plate is designed to reduce wrinkles in said foil, which wrinkles may arise due to surplus foil arising in the assembly process. The foil is being bonded to the support plate along a closed bonding line bounding a substantially circular area in which the support plate is provided with apertures and foil support portions and in which area the foil is adapted to serve as a portion of a wall of a vacuum tight housing of the electron beam device. Another aspect involves a method for using the assembly in a filling machine, as well as a method of reducing wrinkles.

13 Claims, 5 Drawing Sheets

(51) Int. Cl.

| | |
|---|---|
| ***B65B 55/02*** | (2006.01) |
| ***H01J 33/04*** | (2006.01) |
| ***H01J 5/18*** | (2006.01) |
| ***G21K 5/02*** | (2006.01) |
| *H01J 33/00* | (2006.01) |
| *H01J 3/02* | (2006.01) |
| *B65B 55/08* | (2006.01) |
| *H01J 33/02* | (2006.01) |

(52) U.S. Cl.
CPC ................. *H01J 3/027* (2013.01); *H01J 33/00* (2013.01); *H01J 33/02* (2013.01); *H01J 2237/00* (2013.01); *H01J 2237/164* (2013.01); *Y10T 29/49002* (2015.01)

(56) References Cited

U.S. PATENT DOCUMENTS

| | | | | |
|---|---|---|---|---|
| 3,106,660 | A * | 10/1963 | Sheldon | 313/482 |
| 3,406,304 | A | 10/1968 | Brewster | |
| 4,362,965 | A * | 12/1982 | Kendall | 313/420 |
| 4,591,756 | A | 5/1986 | Avnery | |
| 4,755,722 | A * | 7/1988 | Wakalopulos | 315/111.31 |
| 4,801,071 | A * | 1/1989 | Lissit | 228/212 |
| 5,235,239 | A | 8/1993 | Jacob et al. | |
| 5,478,266 | A * | 12/1995 | Kelly | 445/43 |
| 5,524,042 | A * | 6/1996 | Kovacs | 378/161 |
| 5,561,342 | A * | 10/1996 | Roeder et al. | 313/420 |
| 5,962,995 | A | 10/1999 | Avnery | |
| 7,526,069 | B2 | 4/2009 | Matsumura et al. | |
| 2003/0001108 | A1 | 1/2003 | Rangwalla et al. | |
| 2003/0062488 | A1* | 4/2003 | Fink et al. | 250/492.3 |
| 2004/0251229 | A1* | 12/2004 | Okumura et al. | 216/2 |
| 2007/0010120 | A1* | 1/2007 | Flisikowski | 439/326 |
| 2007/0291901 | A1* | 12/2007 | Warburton | 378/140 |
| 2008/0143235 | A1* | 6/2008 | Avnery et al. | 313/420 |
| 2008/0296479 | A1* | 12/2008 | Anderson et al. | 250/226 |
| 2008/0296518 | A1* | 12/2008 | Xu et al. | 250/505.1 |
| 2008/0317209 | A1* | 12/2008 | Sipila et al. | 378/140 |
| 2009/0173897 | A1 | 7/2009 | Decker et al. | |
| 2009/0262900 | A1* | 10/2009 | Mitsuda et al. | 378/145 |
| 2010/0054987 | A1* | 3/2010 | Krueger et al. | 422/3 |
| 2015/0016593 | A1* | 1/2015 | Larson et al. | 378/161 |

FOREIGN PATENT DOCUMENTS

| | | | |
|---|---|---|---|
| CN | 1853252 | A | 10/2006 |
| JP | 50-000799 | B | 1/1975 |
| JP | 5-223997 | A | 9/1993 |
| JP | 2000-206299 | A | 4/2000 |
| JP | 2001-305281 | A | 10/2001 |
| JP | 2002-255124 | A | 9/2002 |
| JP | 2013-519085 | A | 5/2013 |

OTHER PUBLICATIONS

Jaynes et al., "Scalloped Hibachi and Vacuum-Pressure Foil for Electra: Electron Beam Pumped KrF Laser" Pulsed Power Conference, 2007 16th IEEE International, (Jun. 17-22, 2007), vol. 1, pp. 836-830.

Yalandin et al., "A Picosecond-jitter Electron-beam-triggered High-voltage Gas Spark Gap" IEEE Transactions on Dielectrics and Electrical Insulation, (Feb. 2010), vol. 17, No. 1, pp. 35-38.

Supplementary European Search Report issued Jul. 26, 2013, by the European Patent Office in corresponding European Patent Application No. 11 74 0108. (2 pages).

Yalandin et al., "A Picosecond-jitter Electron-beam-triggered High-voltage Gas Spark Gap", IEEE Transactions on Dielectrics and Electrical Insulation, Feb. 2010, pp. 34-38, vol. 17, No. 1.

Jaynes et al., "Scalloped Hibachi and Vacuum-Pressure Foil for Electra: Electron Beam Pumped KrF Laser", Pulsed Power Plasma Science Conference, IEEE, 2007 (month unknown), pp. 826-830.

Japanese Office Action issued by the Japan Patent Office on Sep. 1, 2015 in corresponding Japanese Patent Application No. 2012-551947, and English language translation of Official Action; 7 pages.

English language translation of Japanese Office Action issued by the Japan Patent Office on Dec. 16, 2014 in corresponding Japanese Patent Application No. 2012-551947; 3 pages.

* cited by examiner

-PRIOR ART-

ASSEMBLY AND METHOD FOR REDUCING FOIL WRINKLES

THE FIELD OF INVENTION

The present invention refers to an assembly and a method for reducing wrinkles in an electron exit window foil of an electron beam generating device, which wrinkles may arise due to surplus foil arising in the assembly process, and which foil is bonded to a support plate.

BACKGROUND OF THE INVENTION

Electron beam generating devices may be used in sterilization of items, such as for example in sterilization of packaging material, food packages or medical equipment, or they may be used in curing of e.g. ink. Generally, these devices comprise an electron exit window assembly formed by at least a foil and a support plate. The support plate, which is preferably made of copper, has a plurality of apertures through which the electrons will be exited from the electron beam generating device during operation. The support plate forms a wall of a vacuum-tight housing of the electron beam generating device, and to sustain the vacuum the support plate apertures are covered by a foil. Said foil has a thickness of around 6-10 μm and is preferably made of titanium. Due to the thinness most of the electrons are able to pass through it.

The foil is sealed to the support plate at or near its circumference by bonding. The term bonding should here be interpreted as a general term. Possible bonding techniques may be laser welding, electron beam welding, brazing, ultrasonic welding, diffusion bonding and gluing.

During the delicate handling of the foil in the assembly process surplus foil may arise, for example due to the foil being stretched or in other ways. As the foil and the support plate are fixed to each other at the bonding line, the surplus foil may cause wrinkles in the foil upon application of vacuum in the housing. Large wrinkles are detrimental for the operation of the electron beam generating device, not only because of the reduced efficiency to let electrons pass, but also because of the risk of cracks arising along the wrinkles. The foil is indeed very fragile.

SUMMARY OF THE INVENTION

Therefore, an object of the invention has been to provide an assembly of a support plate and an exit window foil, the support plate being designed to efficiently and carefully reducing wrinkles in the foil.

The object is achieved by an assembly of a support plate and an exit window foil for use in an electron beam device, said support plate being designed to reduce wrinkles in said foil, which wrinkles may arise due to surplus foil arising in the assembly process, said foil being bonded to the support plate along a closed bonding line bounding a substantially circular area in which the support plate is provided with apertures and foil support portions and in which area the foil is adapted to serve as a portion of a wall of a vacuum tight housing of the electron beam device. The assembly is characterized in that the support plate, within said area, is provided with a pattern of apertures and foil support portions alternately, which pattern, when vacuum is created in the housing, is being adapted to form a topographical profile of the foil substantially absorbing any surplus foil.

It is important to realize that surplus foil arising from for example foil stretching need to be taken care where arising.

The support plate and the foil are connected to each other at the bonding line, and any motion between the foil and support plate that can cause an accumulation of surplus foil in some areas, will possibly also cause wrinkles. Hence, the surplus foil needs to be absorbed as much as possible directly down into the support plate, i.e. in a direction perpendicular to the plane of the support plate. Hence the foil may be controlled not to significantly move in relation to the support plate in a direction of the plane of the support plate. The wording absorb is here and in the following used to signify that the foil should be received on a profiled surface in such a way that any extra foil area is allowed to bulge downwards in a controlled way to create a "tensioned" foil. The wording tensioned is here and in the following used to signify that the foil is not able to form large, uncontrollable wrinkles when vacuum is created in the housing. However, the foil is not tensioned in the meaning that there is caused extensive stress in the foil.

In a presently preferred embodiment, said foil and support plate area, within the bonding line, is being defined by a cylindrical coordinate system having an axial axis, a radial axis and an angular axis, wherein said axial axis being aligned with an axial centre axis of the support plate, and said radial axis being aligned with the radius of the support plate within the substantially circular bonding line. The absorption is made in such a way that in the apertures a dominant bending of the foil is created around either the radial axis or the angular axis. It has been realized that the pattern of the support plate should facilitate single-curving of the foil and to avoid double-curving as much as possible. It has been found that harmful wrinkles are more likely to occur in areas where the foil is highly double-curved. In the invention double-curving is reduced to a large extent by giving the foil a dominant bending around either the radial axis or the angular axis. The wording dominant bending is here and in the following defined as essentially single-curving, or single-curving comprising a minor or small contribution of double-curving. It is difficult to completely eliminate double-curving of the foil, but if the foil is forced to bulge or bend as much as possible in one direction, thus creating a dominant bending in that direction, the effects of additional, smaller, bending in any other directions can be reduced. The dominant bending applies both to how it is desired that the foil should bend locally, in each single aperture of the support plate, but also to how it is desired that the foil should bend globally, that is, over a number of neighboring apertures.

Presently preferred embodiments of the invention are described in the dependent claims 3-9.

The invention also comprises a method for reducing wrinkles in an exit window foil of an electron beam device, which wrinkles may arise due to surplus foil arising in the assembly process, said foil being bonded to a support plate along a closed bonding line bounding a substantially circular area in which the support plate is provided with apertures and foil support portions and in which area the foil is adapted to serve as a portion of a wall of a vacuum tight housing of the electron beam device. The method comprises the step of providing, within said area, a pattern of apertures and foil support portions alternately in the support plate, which pattern, when vacuum is created in the housing, is being adapted to form a topographical profile of the foil substantially absorbing any surplus foil.

The invention further comprises a method in a filling machine for sterilizing packaging containers. Said method comprises the step of using an electron beam generating device comprising an assembly according to claim 1.

BRIEF DESCRIPTION OF THE DRAWINGS

In the following, a presently preferred embodiment of the invention will be described in greater detail, with reference to the enclosed drawings, in which.

DESCRIPTION OF A PREFERRED EMBODIMENT

Figure 1:
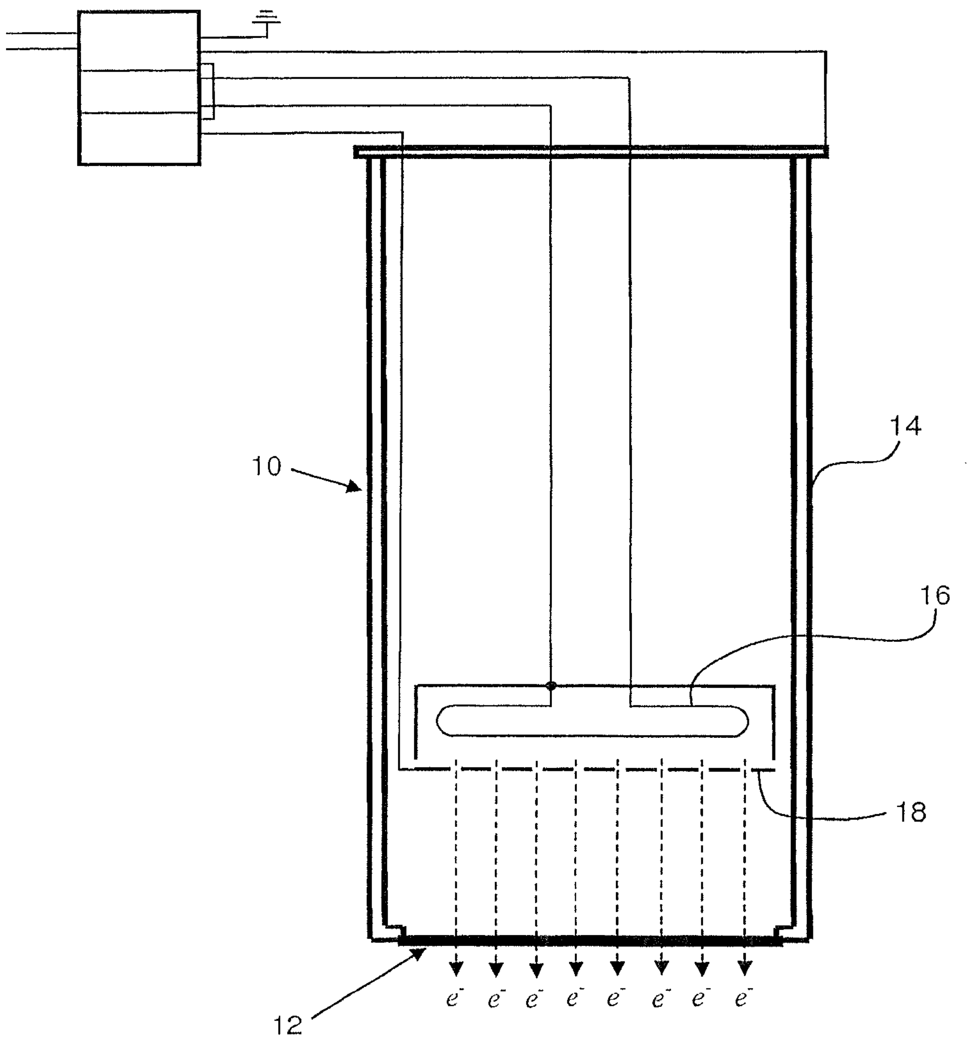
FIG. 1 shows a schematic cross section of an electron beam generating device according to prior art.

FIG. 1 shows a very schematic view of an example of an electron beam generating device 10. The device comprises an electron exit window 12 through which electrons are transmitted towards a target to be irradiated. In accordance with the disclosed design the electron beam generating device 10 generally comprises a vacuum chamber 14 in which a filament 16 and a control grid 18 is provided. The filament 16 is preferably made of tungsten. When an electrical current is fed through the filament 16, the electrical resistance of the filament causes the filament to be heated to a temperature in the order of 2000° C. This heating causes the filament to emit a cloud of electrons $e^-$. The control grid 18 is provided in front of the filament 16 and helps to distribute the electrons in a controlled manner. The electrons are accelerated by a voltage between the grid 18 and the exit window 12. The electron beam generating device 10 is generally denoted low voltage electron beam emitter, which emitter normally has a voltage below 300 kV. In the disclosed design the accelerating voltage is in the order of 70-85 kV. This voltage results in kinetic (motive) energy of 70-85 keV in respect of each electron.

Figure 2:
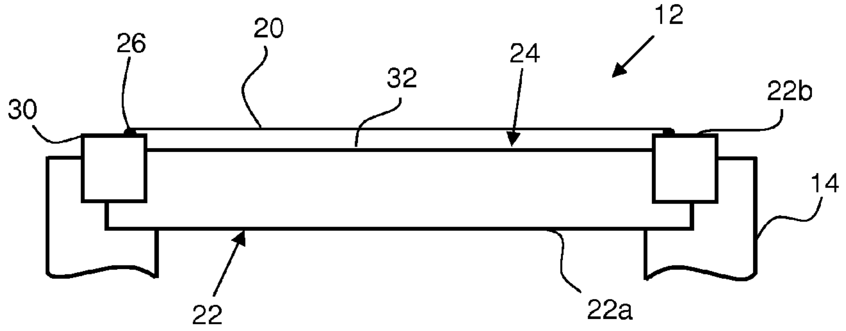
FIG. 2 shows a schematic cross section of a first embodiment of an assembly according to the invention, which assembly is mounted to a partly shown housing of an electron beam generating device.

The electron exit window 12, as shown in FIG. 2, is an assembly of a support plate 22 and an electron exit window foil 20. The foil 20 is attached to an outer surface 24 of the support plate 22, which in FIG. 2 is seen as an upper surface of the support plate 22. Thus, the support plate 22 is provided on the inside of the foil 20, i.e. the foil 20 is facing the surroundings whereas the support plate 22 is facing the interior of the vacuum chamber 14 of the electron beam generating device 10.

The attachment of the foil 20 to the support plate 22 is made along a continuous bonding line 26 (only shown as two points in the figure). The bonding line 26, in its entirety, and the area bounded by it, is represented by a dashed line in FIG. 3, which figure shows the assembly of FIG. 2. In a preferred embodiment the support plate 22 and the foil 20 are circular and the bonding line 26 is bounding a circular area.

Possible techniques for bonding the foil 20 to the support plate 22 may be for example laser welding, electron beam welding, brazing, ultrasonic welding, diffusion bonding and gluing. The bonding line 26 is continuous to be able to maintain vacuum inside the electron beam device. The word "continuous" is used to define that the line is endless or closed.

The foil 20 is substantially transparent to electrons and is preferably made by a metal, for example titanium or by a sandwich structure of several materials. The thickness of the foil 20 is in the order of 6-10 μm.

The support plate 22 serves as a support for the foil 20. In the shown embodiment the support plate comprises two members, a first support plate member 22*a* supporting a central portion of the foil 20 and a second support plate member 22*b*, having the shape of a frame, provided with the foil bonding line 26. The word "frame" should here be interpreted as an element having a central hole configuration. Further, it should be defined that the bonding line 26 extends along the hole configuration but within the perimeter of the frame. Preferably, the bonding line 26 extends at a distance from the perimeter of the frame. Furthermore, at least one bonding line 26 is made. Thus, two or more bonding lines may be made. For example, an inner and an outer bonding line may be made on the frame, and the two lines may, for instance, be concentric with each other.

In an assembled state the two support plate members 22*a* and 22*b* are bonded to each other. The two members 22*a* and 22*b* may be manufactured from different materials, or from a similar material. In a presently preferred embodiment the first support plate member 22*a* is made of copper or aluminum and the second support plate member 22*b* is made of stainless steel.

As can be seen from FIG. 2 the bonding line 26 is positioned on a plateau 30. The second member 22*b* of the support plate, i.e. the frame, is positioned in such a way in relation to the first support plate member 22*a* that the upper surface of the frame forms the plateau 30, i.e. it forms a surface positioned at a higher level than, meaning elevated from, an upper surface 32 of the first support plate member 22*a*.

Figure 4:
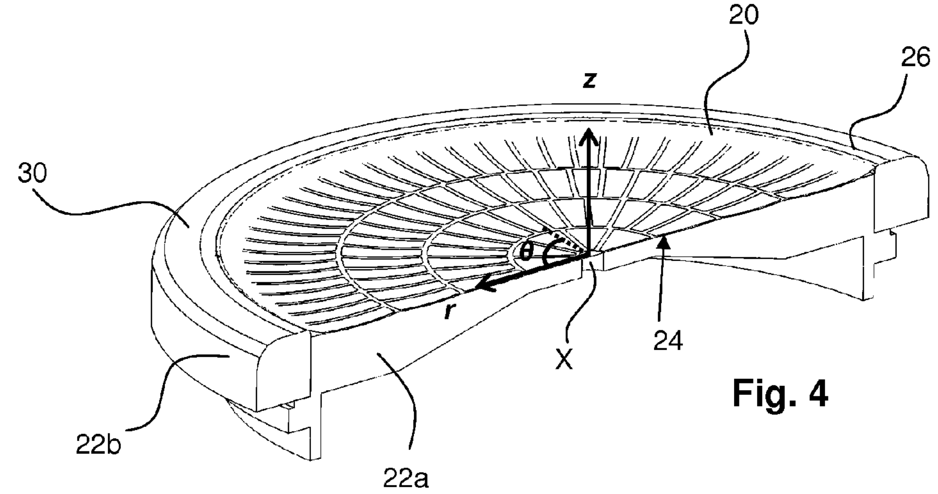
FIG. 4 shows an isometric cross sectional view of the support plate and the foil of the embodiment of FIG. 2.

FIG. 4 shows an isometric cross sectional view of the support plate 22 and foil 20 of the presently preferred embodiment. In the figure the foil 20 is presented as being subjected to vacuum from inside of the electron beam generating device 10. To facilitate describing the invention, and more clearly defining the foil 20 and support plate area within the bonding line 26, a conventional cylindrical coordinate system has been added in the figure. The axial axis or direction, denoted z, of the coordinate system is aligned with an axial centre axis of the support plate 22. The radial axis or direction, denoted r, is aligned with the radius of the cylindrical support plate within the substantially circular bonding line 26. Finally, the coordinate system is having an angular axis or direction, denoted θ, which defines a direction running 360° around the axial centre of the support plate (z direction) along a virtual plane which is orthogonal to the axial centre axis of the support plate (z direction) and to the radial direction r. The virtual plane, which from a coordinate system perspective ought to be planar, substantially corresponds to the outer surface 24 of the support plate. However, it will be shown that the outer surface 24 of the support plate 22 is not planar.

From FIG. 4 it can be seen that the cross section of the support plate 22 is rotational symmetric around the axial axis z.

Figure 3:
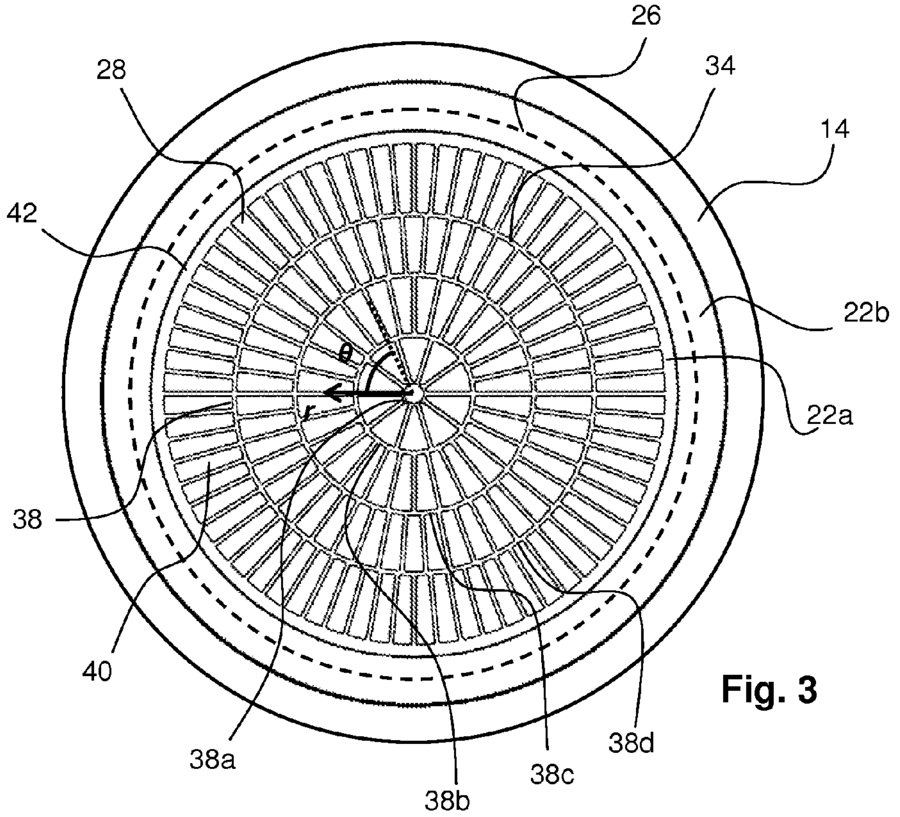
FIG. 3 shows a schematic top view of the embodiment of FIG. 2.

The first support plate member 22*a* is provided with a plurality of apertures 28, shown in FIG. 3, through which the electrons can pass. Further, the support plate 22 is provided with foil support portions 34. Generally, the foil support portions 34 together constitute the area bounding the apertures 28, which area is at least substantially in contact with, but not connected to, the foil 20 when there is provided vacuum in the electron beam device 10. Within the area bounded by the bonding line 26 the support plate 22 is provided with a pattern of these apertures 28 and foil support portions 34 alternately, which pattern, when vacuum is created in the housing, is being adapted to form a topographical profile of the foil 20 substantially absorbing any surplus foil. By absorbing the surplus foil wrinkles may be avoided or at least reduced to a large extent. The wording "topographical profile" is used to describe that the foil 20 will have a non-planar, profiled surface where some areas or points being elevated and some areas or points being countersunk in relation to each other. In the presently preferred embodiment, the pattern of apertures 28 and foil supporting portions 34 is designed in such a way that in the apertures 28 a dominant bending of the foil 20 is being created around the angular axis θ. This dominant bending, the wording of which has been defined in the summary of the invention, is being created in that the foil support portions 34 of the support plate 22, within the area bounded by the bonding line 26, provide a variation in the axial direction z along the radial axis r. Said variation is provided as a concentric waveform 36 extending along the radial axis r. Along the angular direction θ, within the area bounded by the bonding line 26, the support plate is not or only insignificantly varying in the axial direction z.

Figure 5A:
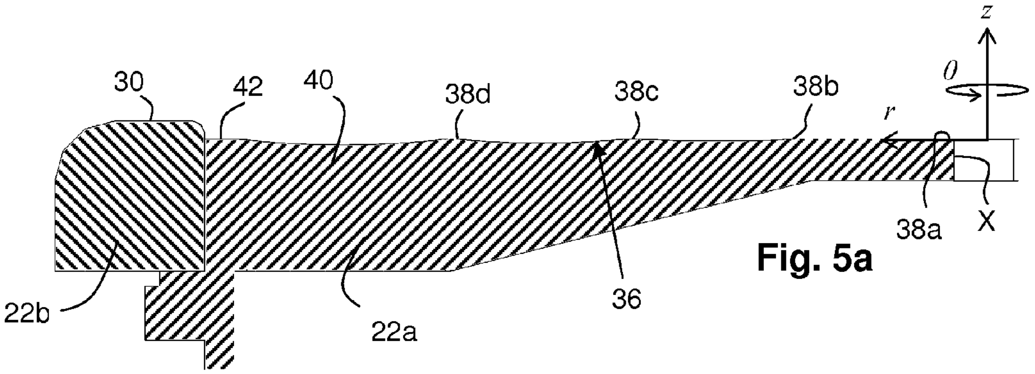
FIG. 5*a* shows a partial cross section of the support plate with cross section through the spokes.

The waveform, denoted 36 and shown in FIG. 5*a*, comprises several waves having different radi and amplitudes. The waveform 36 is formed in that the foil support portions 34 of the support plate 22, within the area bounded by the bonding line 26, provide concentric rings 38 (see FIG. 3) connected to each other by radially directed spokes 40. The radial spokes 40 and concentric rings 38 define the boundaries of the apertures 28, and said concentric rings 38 coincide with wave crests of the waveform 36. In the presently preferred embodiment there are four concentric rings, denoted 38*a*, 38*b*, 38*c*, 38*d*, in the first support plate member 22*a* and one additional ring constituted by the plateau 30 of the second support plate member 22*b*, the additional ring being concentric with the first four. As can be best seen in FIG. 5*a* the upper surface of the spokes 40 between the concentric rings 38 are not planar, but are arc-formed, and thereby form the troughs of the waveform 36. Within the innermost ring 38*a*, i.e. in the centre of the support plate 22, there is provided a centre aperture X.

Further, in FIG. 3 it can be seen that the width of the spokes 40 in the radial direction θ are several times less than the width of the apertures 28 in the same direction. Furthermore, the spokes 40 in the interspace between two rings need not be aligned with the spokes in a neighboring interspace. However, they may be aligned in an alternative embodiment. For the sake of simplicity FIGS. 5*a* and 5*b* only show a cross section through spokes 40 and FIGS. 5*c* and 5*d* only show a cross section through apertures 28. It will be realized that a straight cross section along the radial axis r may comprise both spokes 40 and apertures 28.

From FIG. 3 it can be further seen that the thickness of the concentric rings 38 in the radial direction r is many times less than the extension of the apertures in the radial direction r.

The thickness of the spokes 40 in the angular direction θ is about 0.4 mm and the thickness of the concentric rings 38 in the radial direction r is around 0.4 mm.

The apertures 28 have a longer extension in the radial direction r than in the angular direction θ. In the embodiment shown the extension in the radial direction r is at least double the extension in the angular direction θ. Due to the circular shape of the area bounded by the bonding line 26 the apertures 28 don't have an equal extension in the angular direction θ. The end of the aperture being closest to the centre of the support plate 22 has the smallest extension in the angular direction θ, i.e. the smallest width. The apertures 28 are tapered towards the centre of the support plate 22.

The distribution and mutual relationship between the number of foil support portions 34 and the number of apertures 28 effect the electron transparency of the electron exit window and the cooling of the foil 20. Large and/or many apertures 28 in comparison with the foil support portions 34 give a poorer cooling effect of the foil 20, whereas large and/or many foil support portions 34 in comparison with the apertures 28 give a poorer electron transparency. The pattern of apertures and foil support portions need to be optimised for each specific application. The thickness of the support plate 22 in the axial direction z also effects cooling and electron transparency, and from for example FIG. 4 it is shown that the thickness of the support plate 22 is varying. The centre of the support plate is thinnest, about 2 mm, and the perimeter of the support plate is thickest, about 5 mm.

The spokes 40 and apertures 28 in the outermost interspace do not extend all the way out to the second support plate member 22*b*, but ends a distance from it so that the outer perimeter of the first support plate member 22*a* forms a continuous flange 42. In the embodiment shown this flange 42 is not to be counted as a concentric ring being a wave crest in the waveform 36, but as a planar surface next to the outermost concentric ring being the plateau 30 of the second support plate member 22*b*. This is shown in FIG. 5*a*-5*d*.

Figure 5B:
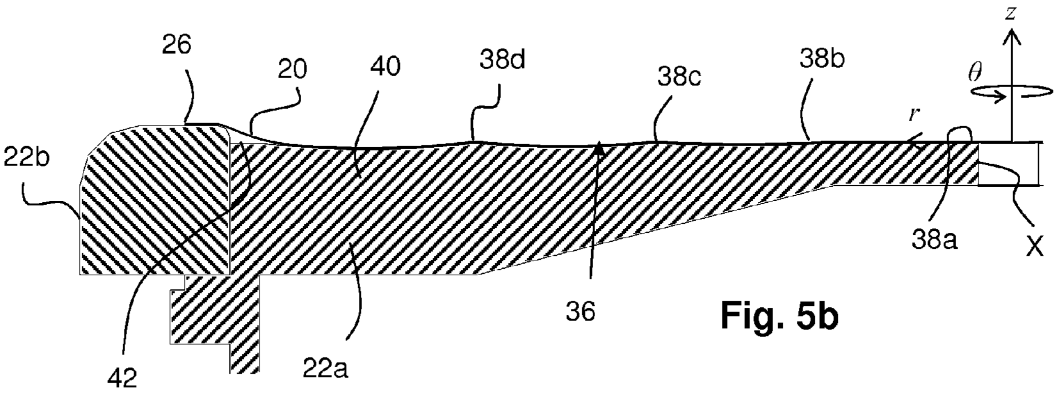
FIG. 5*b* shows a view similar to FIG. 5*a* but with the foil present.
Figure 5C:
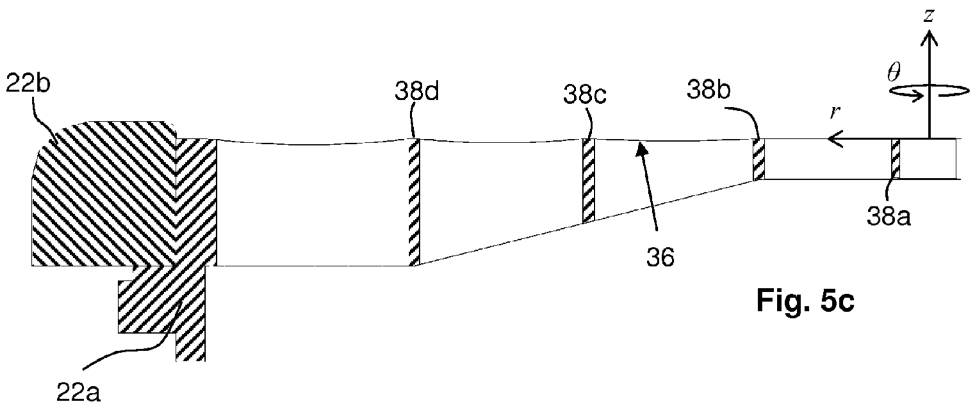
FIG. 5*c* shows a view similar to FIG. 5*a* but with cross section through the apertures.
Figure 5D:
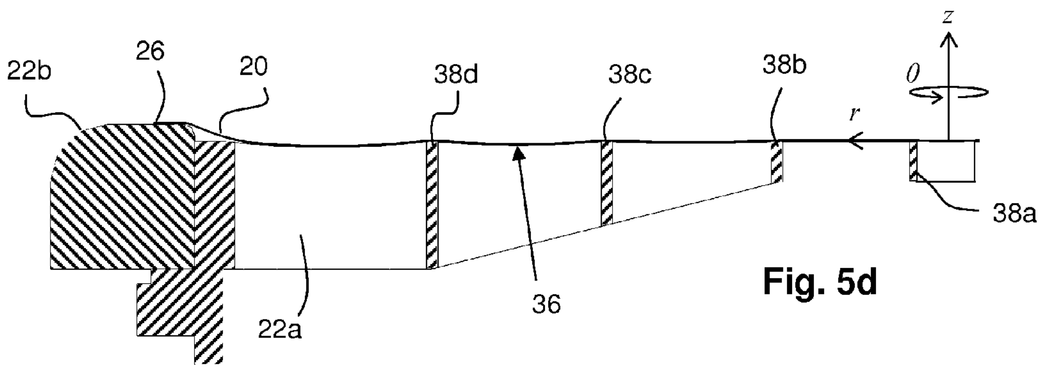
FIG. 5*d* shows a view similar to FIG. 5*c* but with the foil present.

When vacuum is applied the foil 20 is lying on the foil support portions 34 of the support plate 22 and thereby follows the waveform 36. However, in the corner between the first and second support plate members 22*a*, 22*b* the foil 20 will be non-supported, as can be seen in FIGS. 5*b* and 5*d*.

Figure 6:
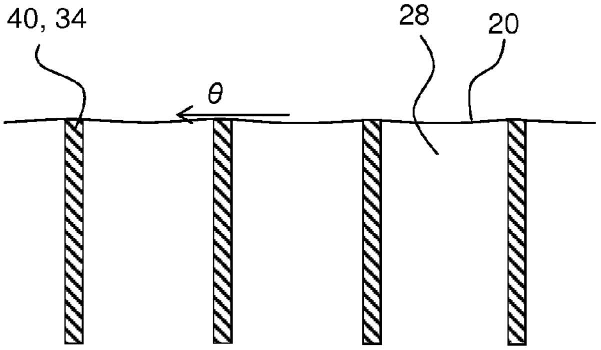
FIG. 6 shows a very schematic representation of a partial cross section of the foil and a couple of spokes, in one interspace, in an angular direction θ.

It has been previously stated that, along the angular direction θ, within the area bounded by the bonding line 26, the support plate 22 is not or only insignificantly varying in the axial direction z. FIG. 6 shows a very schematic representation of a partial cross section of the foil 20 and a couple of spokes 40, in one interspace, in the angular direction θ. The purpose is to illustrate the topographical profile of the foil 20 in this direction when vacuum is applied. As can be seen the foil 20 will be supported by the spokes 40, which are equal in height, but will slightly bulge or bend inward in the apertures 28. The bending will here be made around the radial axis r and will not be considered "dominant" since it will be considerably less than the bending that will take place around the angular axis θ.

It is important to realize that the foil 20 and the support plate 22 are in contact with each other, but not connected to each other in any other point than at the bonding line 26, and that the foil 20, due to the surplus foil, above all the centre of the foil may be slightly moved in the radial direction r in relation to the support plate 22 when the vacuum is applied.

Figure 7:
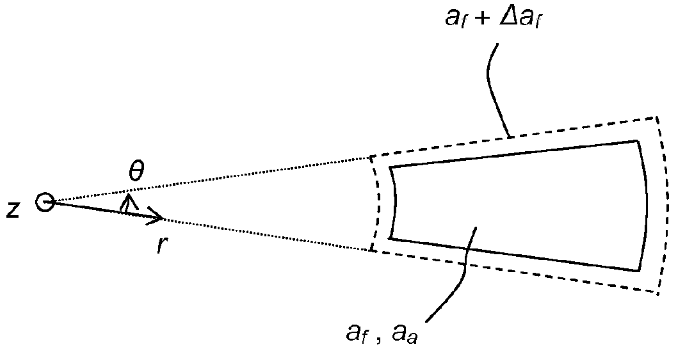
FIG. 7 is an illustration of one single aperture and a portion of the foil.

This could cause an accumulation of wrinkles in some areas depending on the design of the pattern of foil support portions 34 and apertures 28. To avoid such accumulations of wrinkles the pattern needs to be substantially fine and the apertures 28 need to be evenly spread in order to be able to directly absorb as much of the surplus foil as possible substantially perpendicular to the plane of the support plate, i.e. in the axial direction z. Hence the foil 20 may be controlled not to significantly move in relation to the support plate 22. This reasoning may be further developed by studying one single aperture 28 shown in FIG. 7. In general the foil area $a_f$ over the aperture would be similar to the area $a_a$ of the aperture. Due to the assembly process, which for example could lead to foil stretching in the plane of the foil, the foil area may be enlarged by $\Delta a_f$ to a total area of $a_f+\Delta a_f$. When vacuum is applied the aperture should ideally be able to absorb at least a substantial portion of the enlargement $\Delta a_f$ in order to considerably reduce harmful wrinkles. Preferably, the absorption in the radial direction r should be of the same amount as the absorption in the angular direction θ in every coordinate point. Applying this reasoning to one single aperture it may be said that the foil length absorbed in the radial direction r should preferably be equal to the foil length absorbed in the angular direction θ.

The dimensions of the support plate, its spokes, concentric rings and apertures will vary depending on the size of the support plate and the application.

The present invention also comprises a method which to a large extent has already been described in relation to the assembly. The method comprises the step of providing, within said area, a pattern of apertures and foil support portions alternately in the support plate, which pattern, when vacuum is created in the housing, is being adapted to form a topographical profile of the foil substantially absorbing any surplus foil. Preferably, the absorption is made in such a way that in the apertures a dominant bending of the foil is created around either the radial axis r or the angular axis θ.

The invention further comprises a method in a filling machine for sterilizing packaging containers. Said method comprises the step of using an electron beam generating device, of the kind initially described with reference to FIG. 1, comprising an assembly according to the invention. The packaging containers may be of the kind comprising a sleeve and a top. The sleeve may be made of a packaging laminate comprising a core layer of paper and inner and outer layers of polymers. The top may be made of a polymer and may be provided to the sleeve by injection compression in the filling machine. The packaging containers are irradiated for the purpose of sterilizing them by means of an electron beam generating device 10.

Although the present invention has been described with respect to a presently preferred embodiment, it is to be understood that various modifications and changes may be made without departing from the object and scope of the invention as defined in the appended claims.

It has been described an embodiment in which the dominant bending is being created around the angular axis in that the foil support portions of the support plate, within the area bounded by the bonding line 26, provides a variation in the axial direction z along the radial direction r. In an alternative embodiment the dominant bending is being created around the radial axis r in that the foil support portions of the support plate, within the area bounded by the bonding line 26, provides a variation in the axial direction z along the angular direction θ. Said variation may be provided as a waveform swept around the axial centre axis of the support plate. Further, within said area, the support plate, along the radial direction r is not or only insignificantly varying in the axial direction z.

In another alternative embodiment, within the scope of the invention, the dominant bending may be arranged in a different direction from one aperture to the next, or from a section of the support plate to a neighboring section, although it should be understood that when changing dominant bending between apertures or sections, double-curving of the foil 20 may arise.

A two piece support plate has been shown. However, in an alternative embodiment the support plate may be formed as one piece, i.e. the first and second support plate members are merged.

The invention claimed is:

1. An assembly of a support plate and an exit window foil for use in an electron beam device, said support plate being designed to reduce wrinkles in said exit window foil, which wrinkles may arise due to surplus foil arising in the assembly process, the assembly comprising, said exit window foil being bonded to the support plate along a closed bonding line bounding an area in which the support plate is provided with apertures and foil support portions and in which area the exit window foil serves as a portion of a wall of a vacuum tight housing of the electron beam device, the support plate, within said area, is provided with a pattern of apertures and foil support portions alternately, which pattern, when vacuum is created in the housing, forms a topographical profile of the exit window foil absorbing any surplus foil, the exit window foil and support plate area, within the closed bonding line, being defined by a cylindrical coordinate system having an axial axis, a radial axis and an angular axis, said axial axis being aligned with an axial centre axis of the support plate, and said radial axis being aligned with a radius of the support plate within the closed bonding line, and the absorbing of surplus foil is made in such a way that in the apertures a dominant bending of the foil is created around either the radial axis or the angular axis, the foil support portions of the support plate, within said area, being comprised of concentric rings connected to each other by radially directed spokes, the radially directed spokes each having an arc-shaped concave upper surface facing the exit window foil.

2. An assembly according to claim 1, wherein the dominant bending is being created around the angular axis in that the foil support portions of the support plate, within said area, provide a variation in the axial direction along the radial axis.

3. An assembly according to claim 2, wherein said variation in the axial direction along the radial axis is provided as a concentric waveform, and that, within said area, the support plate, along the angular direction, does not vary or varies an amount in the axial direction.

4. An assembly according to claim 1, wherein the radially directed spokes and the concentric rings define the boundaries of the apertures.

5. An assembly according to claim 1, wherein said concentric rings coincide with wave crests of a waveform.

6. An assembly according to claim 1, wherein the closed bonding line is positioned on a plateau.

7. An assembly according to claim 1, wherein the support plate comprises two members, a first support plate member designed to support a central portion of the foil, and a second plate member having the shape of a frame and provided with said closed bonding line.

8. A method for reducing wrinkles in an exit window foil of an electron beam device, which wrinkles may arise due to surplus foil arising in the assembly process, said exit window foil being bonded to a support plate along a closed bonding line bounding an area in which the support plate is provided with apertures and foil support portions and in which area the exit window foil serves as a portion of a wall of a vacuum tight housing of the electron beam device, the method comprising:

providing, within said area, a pattern of apertures and foil support portions alternately in the support plate, which pattern, when vacuum is created in the housing, forms a topographical profile of the exit window foil absorbing any surplus foil, the exit window foil and support plate area, within the closed bonding line, being defined by a cylindrical coordinate system having an axial axis, a radial axis and an angular axis, said axial axis being aligned with an axial centre axis of the support plate, and said radial axis being aligned with a radius of the support plate within the closed bonding line, the absorbing of the surplus foil occurring by a dominant bending of the exit window foil in the apertures created around either the radial axis or the angular axis, the foil support portions of the support plate, within said area, being comprised of concentric rings connected to each other by radially directed spokes, the radially directed spokes each having an arc-shaped concave upper surface facing the foil.

9. A method for sterilizing packaging containers in a filling machine, the method comprising using an electron beam generating device comprising an assembly according to claim 1.

10. An electron beam generating device comprising:

a vacuum chamber configured to be connected to a vacuum source to create a vacuum in the vacuum chamber;

a filament positioned in the vacuum chamber and configured to emit electrons;

a control grid positioned in the vacuum chamber;

an electron exit window through which, electrons emitted by the filament, pass;

the electron exit window comprising an exit window foil and a support plate serving as a support for the exit window foil, the exit window foil being bonded to the support plate along a closed bonding line bounding an area, the support plate including apertures and foil support portions that alternate with one another and form, when the vacuum is created in the vacuum chamber, a topographical profile of the exit window foil absorbing any surplus foil; and the foil support portions comprising concentric rings connected to each other by radially directed spokes, the radially directed spokes each having an arc-shaped concave surface extending between radially adjacent concentric rings and facing the foil.

11. The electron beam generating device according to claim 10, wherein the exit window foil and the support plate area, within the closed bonding line, are defined by a cylindrical coordinate system having an axial axis, a radial axis, and an angular axis, the radial axis being aligned with a radius of the support plate within the substantially circular bonding line, and a dominant bending of the foil is created in the apertures around the radial axis or the angular axis to absorb the surplus foil.

12. The electron beam generating device according to claim 11, wherein the apertures possess boundaries defined by the concentric rings and the radially directed spokes, and the concentric rings coincide with wave crests of a concentric waveform created by a variation in the foil support portions in the axial direction along the radial axis.

13. The electron beam generating device according to claim 10, wherein the radially directed spokes in an interspace between two concentric rings are not aligned with the radially directed spokes in an immediately adjacent circumferential interspace.

* * * * *